United States Patent
Gilman

(10) Patent No.: US 6,369,436 B1
(45) Date of Patent: Apr. 9, 2002

(54) SEMICONDUCTOR WAVELENGTH DEMULTIPLEXER

(75) Inventor: Boris Gilman, 436 Sierra Vista Ave. #8, Mountain View, CA (US) 94043

(73) Assignees: Boris Gilman; Valentin Balter; Michael Lipovich; a part interest ( * ) Notice: Subject to any disclaimer, the term of this patent is extended or adjusted under 35 U.S.C. 154(b) by 0 days.

(21) Appl. No.: 09/576,361

(22) Filed: May 22, 2000

(51) Int. Cl.$^7$ .............................................. H01L 31/105
(52) U.S. Cl. .................. 257/440; 257/184; 257/185; 257/189; 257/191; 257/448; 257/458; 257/459
(58) Field of Search ................. 257/184, 189, 257/191, 201, 431, 440, 448, 458, 459, 615, 185; 250/338.4, 339.01, 339.02, 349

(56) References Cited

U.S. PATENT DOCUMENTS

| | | | | |
|---|---|---|---|---|
| 4,250,516 A | * | 2/1981 | Worlock | 357/16 |
| 4,513,305 A | | 4/1985 | Bloss et al. | 357/30 |
| 4,514,755 A | | 4/1985 | Tabei | 358/44 |
| 4,613,895 A | | 9/1986 | Burkley et al. | 358/41 |
| 4,820,915 A | * | 4/1989 | Hamakawa et al. | 250/211 J |
| 4,975,567 A | | 12/1990 | Bishop et al. | 250/211 R |
| 5,059,786 A | * | 10/1991 | Chu | 250/338.4 |
| 5,138,416 A | | 8/1992 | Brillson | 357/30 |
| 5,298,771 A | | 3/1994 | Mantel | 257/183.1 |
| 6,191,465 B1 | * | 2/2001 | Freeouf | 257/458 |

FOREIGN PATENT DOCUMENTS

| | | | | |
|---|---|---|---|---|
| DE | 35 33 146 | * | 3/1987 | H01L/27/14 |
| JP | 60-247979 | * | 12/1985 | H01L/31/10 |
| JP | 63-170977 | * | 7/1988 | H01L/31/10 |
| JP | 63-170978 | * | 7/1988 | H01L/31/10 |
| JP | 2-292873 | * | 12/1990 | H01L/31/10 |

* cited by examiner

*Primary Examiner*—Eddie Lee
*Assistant Examiner*—Bradley W. Baumeister

(57) ABSTRACT

A solid-state wavelength demultiplexer comprising a plurality of photosensitive elements wherein each element has certain energy gap defined by the material composition. All photosensitive elements are grown on a common substrate where the first grown buffer layer, adjacent and near lattice matched to the first bottom photosensitive element, is heavily doped. A composition of photosensitive elements varies from the first bottom photosensitive element up to a first top photosensitive layer in such a way that corresponding energy gap has a minimum value in the lowermost element while the maximum value in the uppermost element. A wide gap doped "window" layer is grown on top of the uppermost element. Each individual photosensitive element consists of at least three sublayers comprising a first doped sublayer, a second heavily doped sublayer, and a photosensitive undoped sublayer sandwiched between them. Input light signals pass sequentially through the multiple-layered demultiplexer and are selectively absorbed by the photosensitive elements in accordance with the wavelength. The absorbed light signals are converted into electric signals, which are selectively collected at the output of the demultiplexer.

17 Claims, 4 Drawing Sheets

SEMICONDUCTOR WAVELENGTH DEMULTIPLEXER

FIELD OF THE INVENTION

The present invention relates mainly to the fields of optical communication, particularly to multiple wavelength sensitive elements known as wavelength demultiplexers or photoreceivers used for discriminating incoming light signals (optical channels) of different wavelengths and for subsequent forwarding individual optical channels to separate electrical outputs. It can also be used in some other areas such as optical imaging, spectrometry, photoelectric energy conversion, etc.

BACKGROUND OF THE INVENTION

With the explosive growth in demand for telecommunication and data-communication bandwidth, network operators have turned to wavelength division multiplexing (WDM) as a means for increasing the capacity of fiber networks.

WDM is a process in which numerous signals are combined for transmission through a single communications line. Within a data batch each signal has a specific wavelength.

At the output of transmission lines the multiplexed optical channels need to be separated according to their specific wavelengths and forwarded to individual electrical outputs. Separation of optical channels by their wavelengths is accomplished by a device known as a demultiplexer, whereas conversion of optical signals into electrical signals is accomplished by a device known as a photodetector. In other words, a receiving part of each WDM system normally contains an optical demultiplixer and a photodetector line or array with individual photodetectors for individual wavelengths.

In existing WDM systems, a channel wavelength demultiplexing function is typically performed by specific optical devices known as Fiber Bragg Gratings (FBG) or Arrayed Waveguide Gratings (AWG), while individual channel detection and photoelectric conversion are done by means of PIN—photodiodes or avalanche semiconductor photodetectors (APD) [see, e.g., "Understanding Optical Communications" by H. J. R. Dutton, 1998]. In other words, any optical communication system normally has at least two separate groups of devices to carry out the end-point channel analysis (i.e., channel demultiplexing and photoelectric detection).

It is also important to note that existing WDM systems typically use certain spectral ranges to transmit multi-channel optical data. Most popular spectral ranges have a spectral width of 50–100 nm and are located in the vicinity of 1310 nm and 1550 nm wavelength, respectively. It is expected, however, that significant expansion of the useful spectral range will become available in coming years so that future fiber optical communication (FOC) systems will be able to transmit data in wider spectral ranges, e.g., 1200–1700 nm, with a corresponding increase in the number of optical channels. To meet such demultiplexing and photoelectric conversion requirements for normal operation conditions is a challenging task. Therefore a demand may occur for new demultiplexing and photoelectric devices as well as for various combinations of "wide-spectrum" demultiplexers and photoreceivers with known optical devices capable of working in the aforementioned spectral ranges.

Attempts have been made heretofore to combine wavelength demultiplexing and photodetecting functions. Short review of some of such devices is given below.

U.S. Pat. No. 4,514,755 to Tabei discloses a visible color imager wherein partially absorptive layers for blue, green, and red portions of incoming light are incorporated into a MOS/MNOS switching array. However, this device is not applicable to FOC systems because it utilizes spectral ranges different from those in the existing FOC systems and does not possess wavelength discrimination resolution required for such systems.

U.S. Pat. No. 4,613,895 to Burkey B. C. et al. discloses a color responsive image device employing wavelength-dependent light absorption to separate colors in a semiconductor device consisting of a plurality of alternately doped layers. This device entails the same disadvantages as the previous one. Furthermore, if such a device is used in a FOC system, it will have a noticeable optical channel interference (channel cross-talk) because the doped layers of this device will absorb a significant part of light energy from neighboring optical channels.

U.S. Pat. No. 4,975,567 to Bishop S. G. et al. discloses a multi-band quantum well-type photodetector comprising a plurality of GaAs/AlGaAs layers of alternate thickness. Although this device is applicable to FOC systems, it is characterized by very strict requirements to the thickness of individual quantum layers. Furthermore, for better performance this device needs a strictly controlled cooling system.

U.S. Pat. No. 5,138,416 to Brillson L. J. and U.S. Pat. No. 5,298,771 to Mantel D. disclose multilayer imageries comprising pluralities of III–V semiconductor layers made of selected alloy compositions in order to separate and consequently detect the blue, green and red colors in series in optical imaging devices. Along with drawbacks inherent in some of previously described multiplexing devices, the devices of U.S. Pat. No. 5,138,416 and U.S. Pat. No. 5,298,771 utilize a sequential procedure for color channel read-out. This principle is inapplicable to FOC systems, as it will slow down a bit-rate thus limiting an operating speed as well as optical network bandwidth.

U.S. Pat. No. 4,513,305 to W. L. Bloss et al. discloses a multi-wavelength demultiplexer comprising a plurality of III–V semiconductor layers made of selected alloy compositions and energy gaps in order to separate and consequently detect different spectral portions of incoming radiation thus performing combined demultiplexing and photoelectric conversion functions in the same monolithic device. However, the device of U.S. Pat. No. 4,513,305 has the a number of disadvantages which are described below. In particular, it requires the use of relatively thick photosensitive layers combined with the wide-gap buffer layers which increases the total number of layers as well as the thickness of the device as a whole. This contributes to complexity of the device structure and makes it expensive to manufacture. Optical channel photodetection from a single photosensitive layer of large length by means of two side contacts can not be made fast enough for a modern FOC system due to the finite electron-and-hole drift time through the layer. Two-sided connection to each photosensitive layer makes the design more complicated and the operation less reliable.

OBJECTS OF THE INVENTION

It is an object of the present invention to provide a semiconductor wavelength demultiplexer which is simple in construction, reliable in operation, is capable of discriminating a number of wavelengths, may efficiently utilize layers of different energy gaps with reduced channel "cross-talk", does not slow down a bit-rate and hence does not limit an operating speed as well as optical network bandwidth, can perform well without strict thickness control, and does not require cooling, makes it possible to reduce number of optical components necessary to demultiplex and detect an optical signal, allows for an usage of wider transmission spectral range, and allows for a decrease in the thickness of the layers.

SUMMARY OF THE INVENTION

In accordance with the present invention, there is provided a solid-state wavelength demultiplexer comprising a plurality of photosensitive semiconductor compound layers wherein each layer has a certain energy gap defined by the composition of its material. All layers are grown on a common substrate where the first grown buffer layer, adjacent and near the lattice matched to the first bottom photosensitive layer, is heavily doped. Compositions of photosensitive layers vary from the lowermost photosensitive layer to the uppermost photosensitive layer in such a way that a corresponding energy gap has the minimum value in the lowermost layer and the maximum value in the uppermost layer. A wide-gap "window" layer is grown on the top of the uppermost photosensitive layer. An anti-reflection coating may be deposited on top of the "window" layer.

Each photosensitive layer of a given energy gap, in turn, comprises a heavily doped sublayer of one type of conductivity, adjacent to the next upper photosensitive layer (the one with a wider energy gap), followed from the bottom by an undoped sublayer in which light induces a carrier generation process. Furthermore, an electron-hole separation process takes place mainly in this sublayer. The aforementioned undoped sublayer is followed by another doped sublayer which is adjacent to the next lower photosensitive layer and which has conductivity of a type opposite to that of the aforementioned heavily doped sublayer. The demultiplexer is further provided with a common heavily doped layer of the same type of conductivity as the aforementioned lower doped sublayer in each of the photosensitive layers. This common layer is electrical contact to all aforementioned lower doped sublayers. Furthermore, a plurality of etched-off steps and contact regions are formed on one side of the device to provide electrical outputs to all photosensitive layers through the upper doped sublayers. The demultiplexer of the present invention makes it possible to reduce channel power loss and eliminate inter-channel "cross-talk" while maintaining high quantum efficiency for optical channel detection.

DETAILED DESCRIPTION OF THE INVENTION

Figure 1:
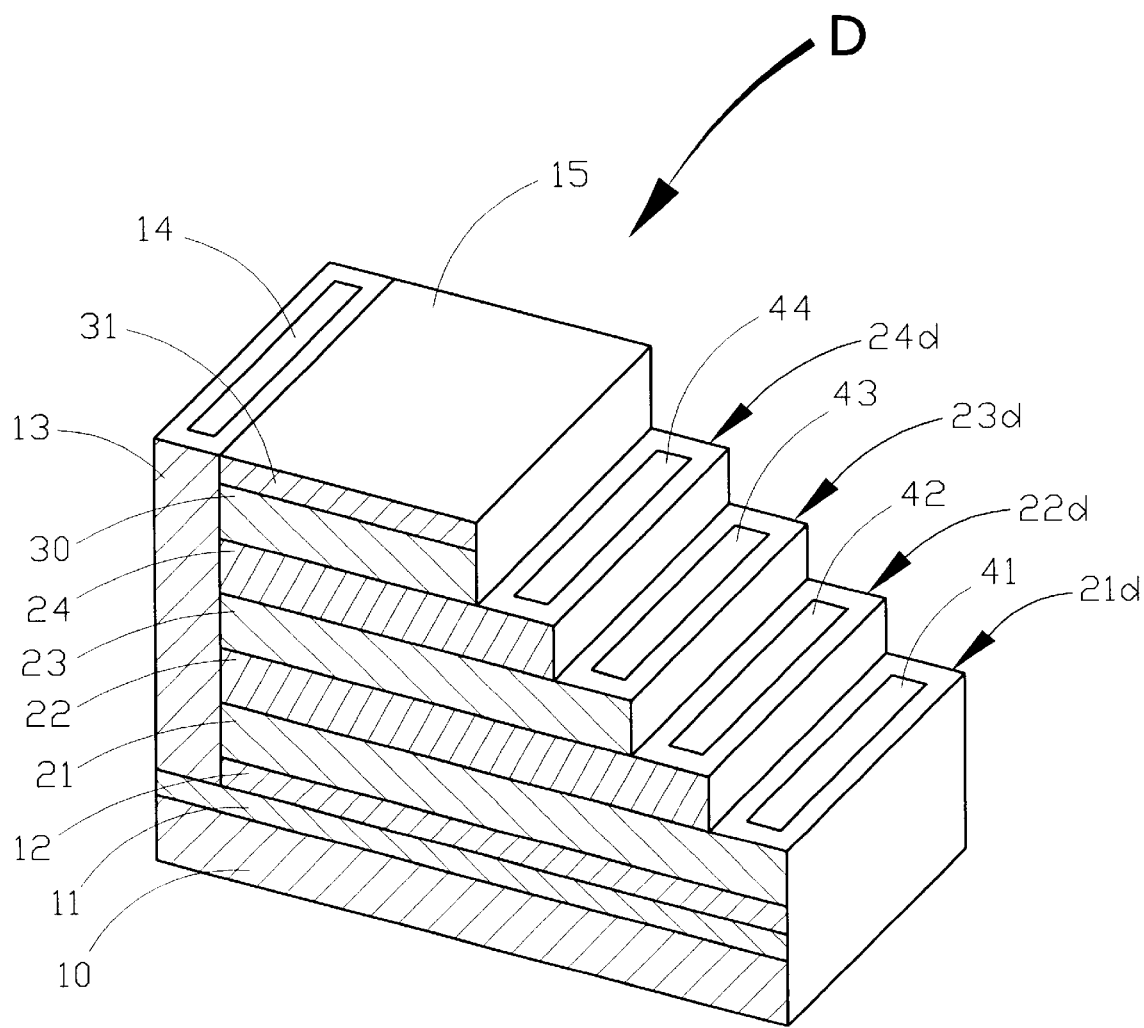
FIG. 1 is a three-dimensional view of a semiconductor demultiplexer of the present invention with a longitudinal cross section.

FIG. 1 is a three-dimensional view of a semiconductor demultiplexer D of the present invention in a longitudinal cross section. In the embodiment shown in FIG. 1, the demultiplexer D has a four wavelength (channel) demultiplexing structure and consists of a plurality of compound semiconductor layers 12, 21, 22, 23, 24, and 30 grown on a common substrate 10. Material compositions and related energy gaps Eg of layers 12, 21, 22, 23, 24, and 30 vary from layer to layer while remaining constant throughout the most part of each individual layer. The layers 21, 22, 23, and 24, which hereinafter will be referred to as photosensitive elements, have the same three-sublayer structure but differ in the material which determine the energy gap, i.e., wavelength filtering ability. Each of the photosensitive elements 21, 22, 23, and 24 consists of three sublayers, which will be described in detail later. At this stage of the description for the convenience of explanation all photosensitive elements 21, 22, 23, and 24 will be considered as monolithic layers.

All aforementioned layers are formed by means of well-known processing techniques such as MBE or MOCVD. MBE means Molecular Beam Epitaxy and MOCVD means Metal Organic Chemical Vapor Deposition, a materials science technology used for growing compound semiconductor-based epitaxial wafers and devices.

Materials for the layers 12, 21, 22, 23, 24, and 30 can be chosen from the ternary or quaternary III–V compounds such as GaInAs, GaInAsP, GaInAsSb, GaAlAs and the like, which are selected based on the required wavelength spectral range and additionally on the lattice match criteria. For example materials like Ga(x)In(1−x)As and Ga(x)In(1−x)As(y)P(1−y) look suitable for the usage in wide band Fiber Optic Systems (1200–1650 nm) including so called C- and L-bands of a conventional optical network wavelength range (1525–1625 nm). AlInP or GaAlInP compounds are suitable for near infrared and visible ranges (400–900 nm) and so on. In each specific application the composition of the material is chosen so as to make photosensitive elements 21–24 selectively absorptive to certain wavelengths or, to be more precise, to narrow ranges of wavelengths centered on certain wavelengths. The common substrate 10 can be chosen from well known materials, such InP or GaAs or Si, which provide desirable mechanical support and ensure best possible interface with the first grown layer 12. Specific choice for the substrate 10 should be made based on the type of materials chosen for the photosensitive elements 21–24 as well as the lattice match consideration. InP is one of the best possible candidates for the photosensitive layers made of the ternary or quarternary compounds, such as GaInAs and GaInAsP.

Furthermore, according to the present invention, the common substrate 10 includes a heavily doped buried layer 11 of one type of conductivity followed by the a layer 12 of the same type of conductivity grown on the layer 11.

The photosensitive elements 21, 22, 23, and 24 are grown sequentially on the layer 12 in such a way that each photosensitive element is made sensitive to a predetermined wavelength or to a specific narrow wavelength range. This is achieved due to a light absorption threshold control defined by the Eg value of each element. It is accomplished by varying material composition of the photosensitive elements 21, 22, 23, and 24, and hence the corresponding Eg values, in such a way that the lowermost photosensitive element 21 has the lowest value of Eg and is made sensitive to the longest wavelength of the working range, while uppermost element 24 has the highest value of Eg and is made sensitive to the shortest wavelength of the working range. The intermediate elements 22, 23 have some intermediate values of Eg and are made sensitive to the other two (for the illustrated 4-channel demultiplexer design) intermediate wavelengths or wavelength bands. A wide-band doped layer 30 of a conductivity type opposite to that of the layer 12 is grown on top of the uppermost photosensitive layer 24 to serve as an optical "window" and electrical contact to the uppermost layer 24. Finally, an anti-reflection layer 31 is deposited on the surface of the layer 30 to improve incoming light absorption in the device as a whole.

The photosensitive elements 21, 22, 23, and 24 are different in length with the longest element 21 being at the lowermost one and with the shortest element 24 being the uppermost one of the stack. The ends of the elements on one side of the stack are aligned and are in good electrical contact with a common vertical layer 13, whereas the ends of the elements on the opposite side of the stack have exposed surfaces in the form of four steps 21d, 22d, 23d, and 24d.

The common vertical layer 13 is doped and of the same type of conductivity as the layer 12. This doped layer 13 can be formed either by appropriate high energy and high dose ion implantation with consequent annealing or by using some special doping technique provided for forming very deep doped layers in III–V multilayer structures. One of such methods known as transmutation doping is described, e.g., in: "Semiconductor Technology", chapter 2, p.17 by V. V. Kozlovski and L. F. Zakharenkov (John Wiley & Sons, Inc., 1997). The layer 13 is formed in such a way that it penetrates through the layer 30, all photosensitive elements 21–24, and the layer 12, thus making electrical contact to all heavily-doped bottom sublayers of all photosensitive elements 21–24 and to the buried layer 11 as well. The top surface of layer 13 has an electrical contact area 14 made by a conventional photolithography and metallization procedures.

The wide-gap "window" layer 30 is grown on top of the uppermost photosensitive element 24 by conventional MBE or MOCVD methods known in art. An anti-reflection film 31 is deposited on top of the wide-gap "window" layer 30, also by a known method.

The aforementioned steps 21d, 22d, 23d, and 24d can be formed by photolithography and etching. If necessary, some additional etch-stop sublayers, which, however, are not essential for the present invention, can be introduced to the structure of the device. Furthermore, the steps 21d, 22d, 23d, and 24d have exposed electrical contact regions 41, 42, 43, 44. The electrical contact regions 41, 42, 43, 44 provide electrical connection to each of the photosensitive elements 21–24 and can be made by appropriate photolithography, etch-off, and metallization processes. Additional standard masking and implant procedures, although not shown, can be used before metallization to form contact regions inside step areas when needed. The width of the side steps is chosen to be significantly shorter than the size of the photosensitive area to ensure low power losses and practically equal proximity of contact regions 41–44 to the illuminated area.

Figure 2:
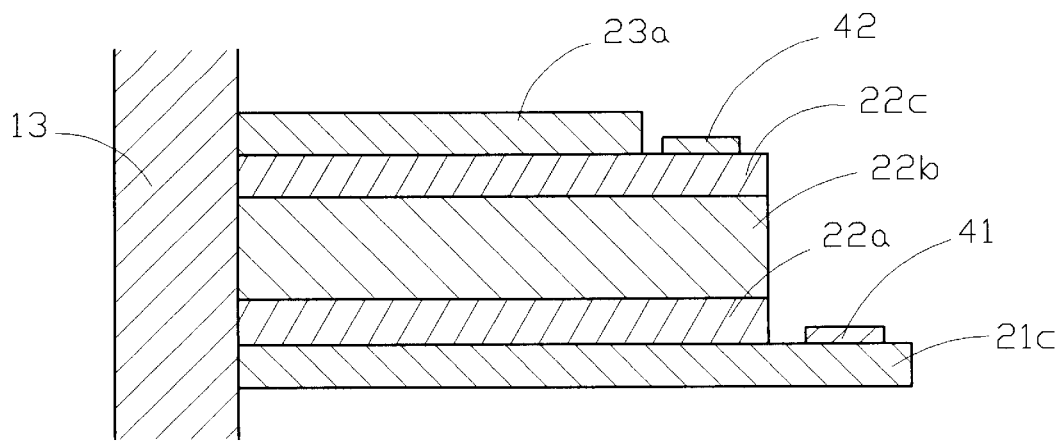
FIG. 2 is a fragmental view of the device of FIG. 1 illustrating the structure of one of the photosensitive elements.

As has been mentioned above, each of photosensitive elements 21, 22, 23, and 24 has a multilayer structure. The structure of one of the photosensitive elements, in the illustrated case of the element 22, is shown in FIG. 2. It can be seen from this drawing that the photosensitive element 22 consists of three sublayers 22a, 22b, and 22c grown sequentially on top of each other. The sublayers 22b and 22c have constant values of their respective energy gaps Eg, whereas the sublayer 22a may have a graded gap structure described below. All three sublayers are of different types and have different levels of conductivity.

The mentioned sublayers 22a, 22b, and 22c are doped during their sequential growth by means of well known doping procedures accepted in the III–V compound growth. In the fragment of the present device shown in FIG. 2, the sublayer 22c is a highly doped thin layer of conductivity opposite to that of the layer 12. The thick sublayer 22b is an undoped or lightly doped layer of the same type of conductivity as the layer 12. In this sublayer the most of the light signal at a given wavelength or wavelength range is absorbed causing electron-hole generation. The sublayer 22a is another thin doped layer of the same type of conductivity as the layer 12. A thickness and doping level of the sublayer 22c are designed to ensure full transparency of the sublayer 22c to the given wavelength or wavelength range as well as an appropriate low resistance of the layer between the illuminated area 15 and contact area 42. The thickness of the sublayer 22b is designed to ensure absorption of a significant part of incoming light of the designated wavelength (say 75–90%) combined with the highest possible quantum efficiency. The thickness and doping level of a sublayer 22a are designed to ensure full absorption of the remaining part of the light left unabsorbed in the sublayer 22b (i.e. 10–25%), good electrical contact with the common vertical layer 13 as well as low absorption for the longer wavelength range designated for the lower adjacent photosensitive element 21. The described sublayer structure for the element 22 apparently applies to all other photosensitive elements of the present invention.

It should be noted that along with all photosensitive elements 21–24 and layer 12, the vertical layer 13 is in good electrical contact with the aforementioned sublayer 22a of the photosensitive element 22, as well as with the buried layer 11.

If necessary, additional standard masking and implant procedures can be used before metallization to form contact regions inside step areas.

Figure 3:
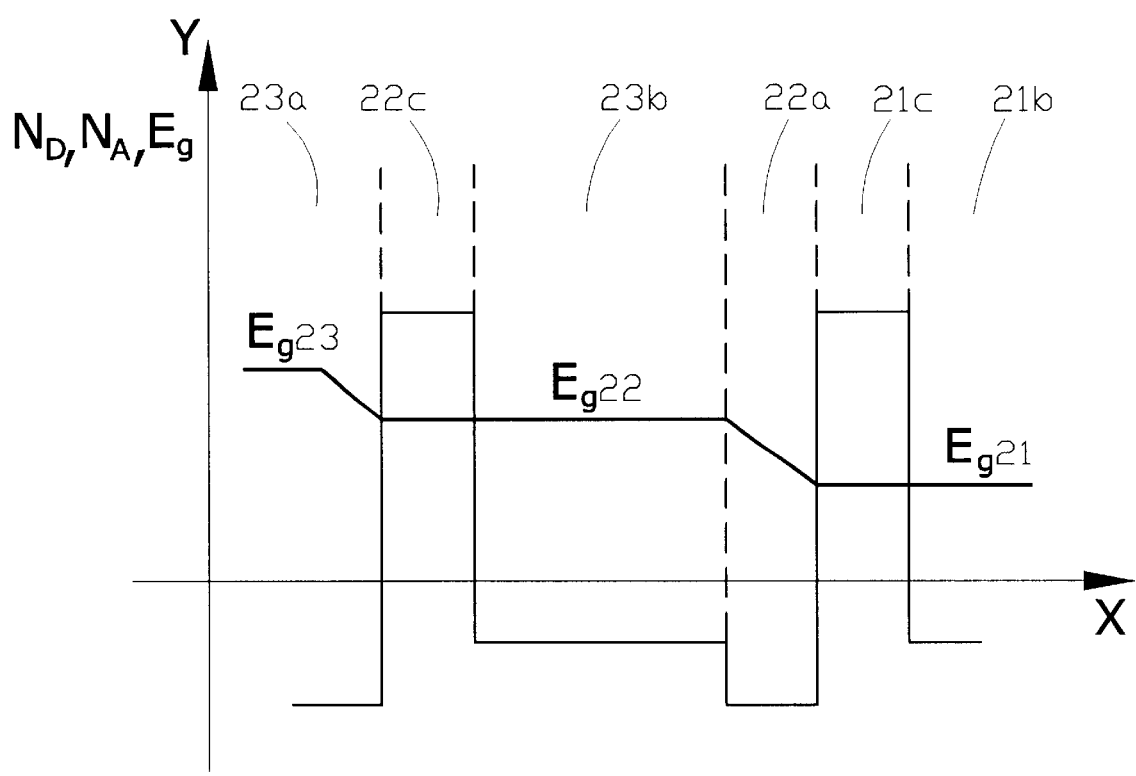
FIG. 3 is a graph showing an energy gap and concentration profiles in and around the photosensitive element of the present invention.

FIG. 3 shows concentration (doping) and energy gap profiles for one of photosensitive elements of the device, in the illustrated case for the photosensitive element 22 of FIG. 2. The abscissa axis X shows sequence of the layers, and the ordinate axis shows the doping level and the energy gap of the layers. The sublayer 22c is a 0.1–0.3 $\mu$m thick heavily doped N-type sublayer with the doping level of about 5E18–5E19/ccm, the sublayer 22b is a 1.5–2.0 $\mu$m thick undoped or lightly doped P-type layer, while the sublayer 22a is a 0.3–0.7 $\mu$m thick moderately or high doped P-type sublayer with the doping level of 1.0–5.0E18/ccm. In this embodiment the layers 12, 13 and a buried layer 11 (FIG. 1) all have P-type conductivity with the doping level ranging between 5.0E18 and 5.0E19/ccm.

As shown in FIG. 3, the energy gap Eg remains constant throughout the sublayers 22c, and 22b, while changes with some gradient in the sublayer 22a, which is on the border between the photosensitive element 22 and the underlying element 21. In some other embodiments of the present invention each photosensitive element may have small portion of graded Eg in the transition region overlapping or coinciding with the bottom P-type sublayer 22a. A provision of such an energy-transition sublayer in the structure of a photosensitive element improves wavelength confinement within the designated element and thus, along with interface quality enhancement, protects the demultiplexer from having optical channel "cross-talk".

Figure 4:
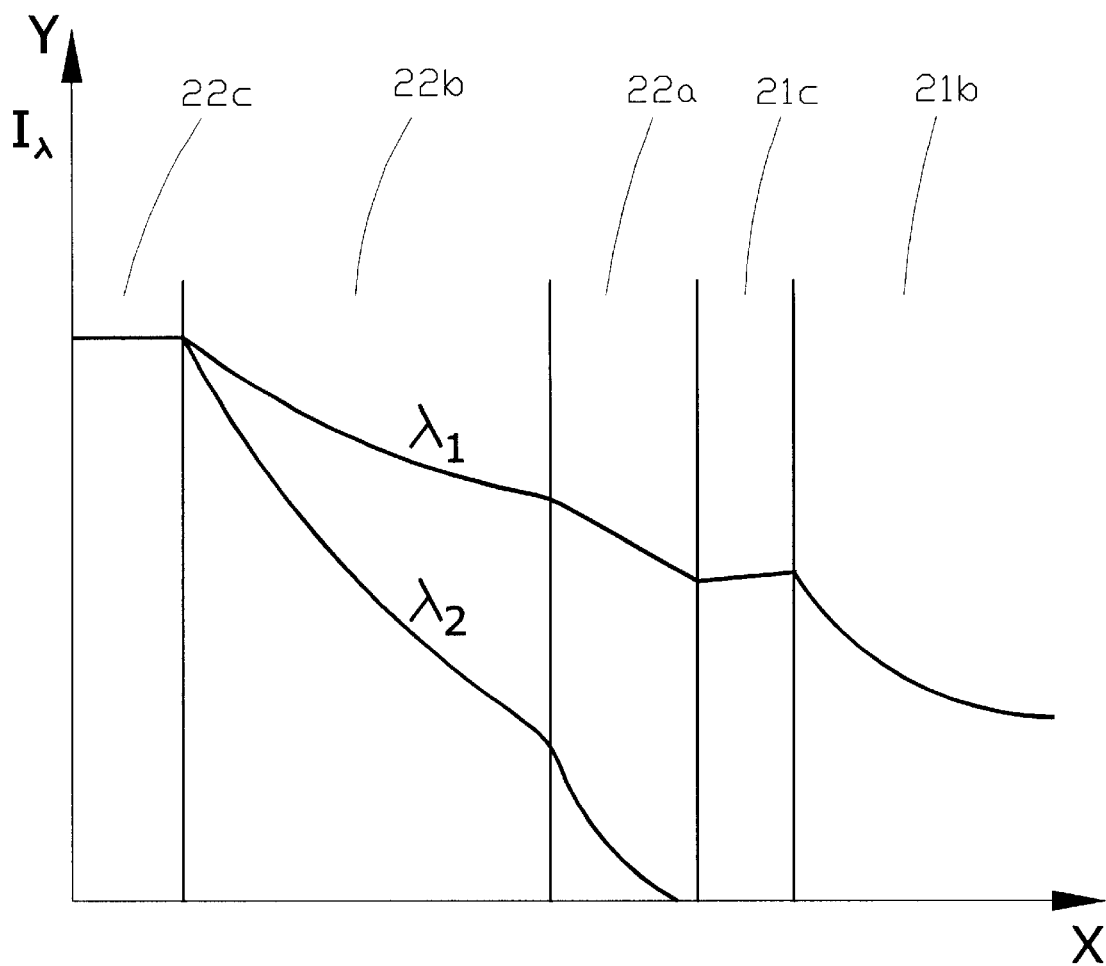
FIG. 4 shows light intensity attenuation within a photosensitive element for two neighboring wavelengths.

FIG. 4 is a graph illustrating light intensity attenuation (the ordinate axis Y) through the sublayers (abscissa axis X) of the photosensitive element 22. This graph shows variations in intensity attenuation of two incoming WDM light signals having neighboring wavelengths. The variation is shown throughout the sublayers of the element 22. A relatively short wavelength λ2 corresponding to one incoming light signal is almost fully absorbed in the sublayer 22b with a small tale thereof being completely extinguished within the sublayer 22a. A longer neighboring wavelength λ3 of a neighboring light signal, which is assigned to the underlying photosensitive layers 21 is absorbed in the element 22 only partially, whereas the major part thereof passes through the next photosensitive element 21. Channel power loss due to partial absorption of the longer wavelength within a photosensitive element 22 puts some limits on the wavelength resolution and can be optimized by slightly adjusting thickness and doping levels of sublayers 22b and 22a. Expected wavelength resolution in the 1200–1600 nm range is about 30–50 nm with channel power losses maintained below 30%.

Figure 5A:
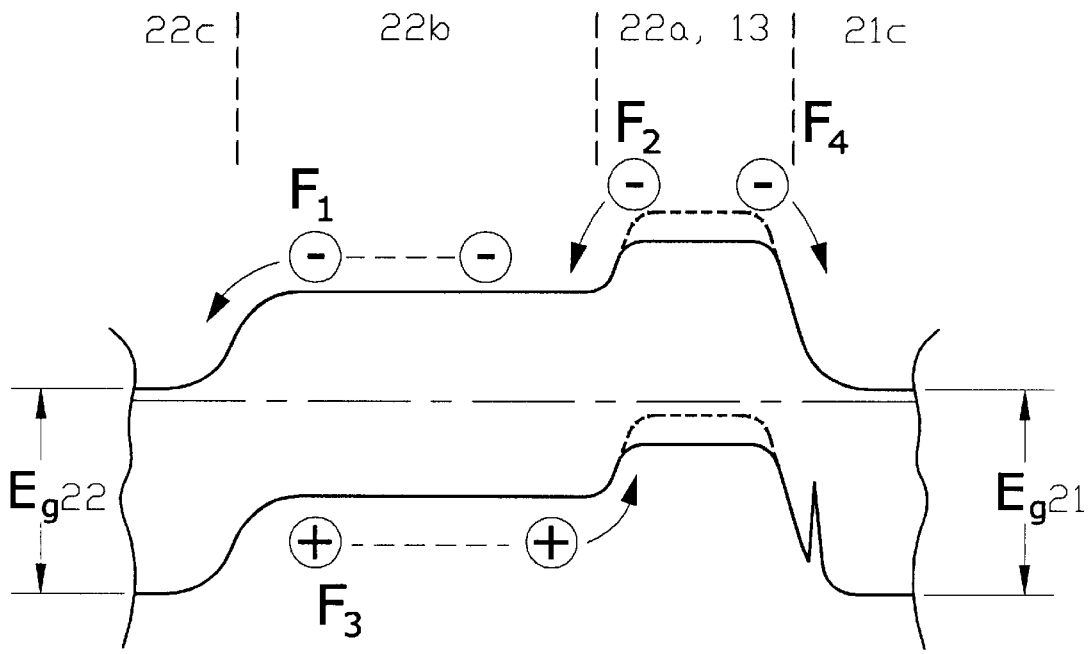
FIGS. 5A and 5B are energy band diagrams of a photosensitive element exposed to an optical signal in unbiased and biased modes of operation.
Figure 5B:
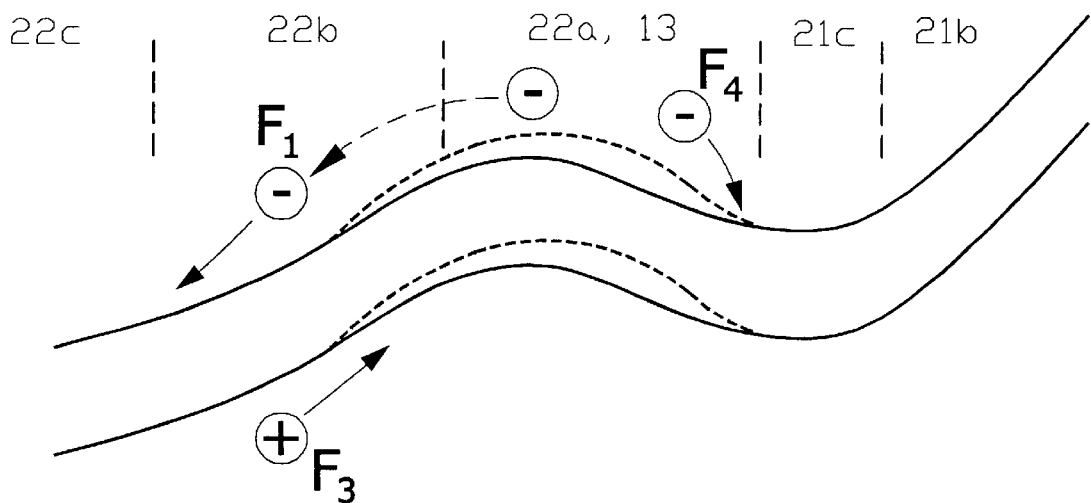

FIGS. 5A and 5B are energy band diagrams of the photosensitive element 22 of the present demultiplexer in an operating mode. FIG. 5A refers to an photovoltaic mode of operation at which no bias is applied to the output 42 relative to the common ground terminal 14, while FIG. 5B refer to a PIN diode mode of operation at which the bias of reversed polarity is applied to the output terminal 42 relative to the common ground terminal 14.

The device of the invention operates as follows:

The incoming light in the form of a plurality of light signals having different wavelength is directed to the photoreceiving surface 15, passes through the anti-reflection layer 31 and wide-gap window layer 30, and penetrates further through the photosensitive elements 24–21 towards the substrate 10. Although the light passes through all the layers and is partially absorbed in all photosensitive layers 24–21, as an example, the photoelectric processes, which occur in each of the photosensitive elements, will be considered in detail only for the element 22.

As shown in FIG. 5A and FIG. 5B, in both cases the incoming light of a given wavelength causes in a corresponding photosensitive element, in the illustrated case in the element 22, generation of electron-hole pairs. In these graphs, energy levels are plotted on the ordinate axis and sequential sublayers are arranged along the abscissa axis. Due to high concentration of electrons in the sublayer 22c which causes effective widening of energy gap Eg (see, e.g., "Doping in III–V Semiconductors" by E. F. Shubert, section 1.3.2, p. 37; Cambridge University Press, 1993), this sublayer is practically transparent to the given wavelength so that the major part of the incident optical radiation of the given channel is absorbed in the adjacent sublayers 22b and 22a. This causes formation of electron flows F1 and F2 toward the sublayer 22c. Simultaneously, a hole flow F3 having a direction opposite to the flows F1 and F2, i.e. from the sublayer 22b to the sublayer 22a, is formed. Due to sufficient thickness and low doping level of layer 22b, the major part of light of a given wavelength is absorbed in this sublayer, causing efficient electron-hole pair generation and charge separation between sublayers 22c and 22a. As a result, a corresponding electrical current, which flows through the circuit formed between contact regions 13, 14 and 42 (FIG. 1) is generated. Some parasitic electron flow F4 may occur between the sublayers 22a and 21c, resulting in partial mixing up outputs of photosensitive elements 22 and 23 (channels "cross-talk"). This drawback, however, can be easily eliminated by adjusting the thickness of a sublayer 22a and bringing it into compliance with the optimized light attenuation function shown in FIG. 4. This adjustment will be described in detail later.

The sublayer 22a has two functions. First, it serves as a potential barrier for the electrons generated in the sublayer 22b helping to direct them back to the conductive layer 22c electrically connected to the output contact region 42 (FIG. 1). Second, due to a moderately high acceptor-type doping combined with a graded gap portion, the adsorption of light in this sublayer is higher than in the sublayer 22b (see above reference, section 1.3.5, p.48). This ensures full absorption of the remaining part of the channel radiation left unabsorbed in the sublayer 22b. Due to a lower diffusion length in a sublayer 22a, some electron-hole losses can be expected inside the sublayer to extent affecting quantum efficiency of the whole photosensitive element 22 (or of any other photosensitive element in the respective case). This impact however is not significant due to a relatively small part of radiation absorbed in the layer 22a and can be further reduced by optimizing thickness and doping levels in the sublayers 22b and 22a.

FIG. 5B shows a band diagram of the same photosensitive element in the biased (PIN) mode of operation, wherein the bias of the reversed polarity is applied between contact 42 and common region 13 (FIG. 1) making the N-I-P junction formed between the sublayer 22c and sublayers 22b, 22a and 13 to be a reversed bias. In this mode of operation, a strong electrical field is developed through the sublayer 22b with a small fraction of it penetrating into the sublayer 22a. This results in much better separation of electrons and holes generated in the sublayers 22b and 22a and in higher output current flowing between contact regions 42 and 13–14 (FIG. 1). According to the present invention, this mode of operation is preferable.

Dashed lines in the energy diagram of FIG. 5A and FIG. 5B relate to the potential barrier formed between the photosensitive sublayer 22b and the common ground layer 13 (FIG. 1) where the potential drop and corresponding electric field are developed horizontally along the boundaries of the sublayers 22c, 22b, and 22a. In general, potential and electric field distributions across the photosensitive layer 22 or any other of photosensitive layers have essentially two-dimensional patterns which can be easily simulated by means of well known computer simulating tools such a PIESCES or the like. However, it is not in contradiction with the wavelength demultiplexing and PE wavelength detection described above.

A device of the present invention can be used for some infrared wavelength ranges including those at or around 1300 nm and 1550 nm. This makes the device a good candidate for FOC system applications, particularly as a single-chip wavelength demultiplexer-receiver. Based on certain III–V materials, such as, e.g., GaInAsP, a very wide spectral range, e.g., 1200 nm–1700 nm, can be used for wide-band FOC systems. By using some other compound materials the present device can be also made sensitive to some other spectral ranges, including both IR and visible parts of spectrum. This feature makes the device of the invention applicable to optical imaging, spectral analysis, photovoltaic solar energy conversion, temperature measurements, and the like.

Although the invention has been described with reference to specific embodiments, it is understood that application of the invention is not limited to these embodiments and that any changes and modifications in the shapes, materials, and structural details are possible, provided they do not depart from the scope of the attached patent claims. For examples, the structure of photosensitive elements was described with reference only to the layer 22. It is understood that the same principles of design are equally applicable to all other layers or photosensitive elements of a multiple-layered demultiplexer of the present invention. Furthermore, a multiple-layered semiconductor wavelength demultiplexer of the invention was exemplified having four elements. It is understood that it may have more or less than four elements with a sublayered structure described above. For example, an eight-channel (wavelength) demultiplexer can be built using the same approach for the same or wider spectral range.

It should be noted that the present invention makes it possible to reduce number of optical components necessary to demultiplex and detect an optical signal, thus reducing system complexity and cost. Also with the present demultiplexer designed for the certain number of channels, the requirements to conventional optical filtering and demultiplexing devices can be reduced thus allowing an increase in the number of channels, i.e. obtaining better bandwidth.

Doping compounds and their concentration also have been given as examples. It is understood that any other doping components used in different proportions can be used, provided that the principle of discrimination and photoelectric conversion of light signals based on described composed and doped layers and sublayers are observed. The device of the present invention combines both de-multiplexing and detection functions under a single chip operation.

The exposed electrical contact regions were shown in a step-like form. It is understood, however, that the exposed portions of the sublayer 22c and of other similar sublayers can be formed in different location, e.g., by etching selected areas of the demultiplexer for reaching appropriate sublayers.

What is claimed is:

1. A solid-state wavelength demultiplexer, comprising:
   a multiple-layered stack of individual photosensitive elements which are sequentially built on a common substrate and have individual selectivity to wavelength of input light signals defined by a predetermined energy gap of each said individual photosensitive elements, said predetermined energy gap being sequentially increased in the direction from said common substrate toward said individual photosensitive elements;
   each of said individual photosensitive elements having a multiple-layered structure comprising the following sublayers stacked on each other in said direction: a first doped sublayer of one type of conductivity, a second doped sublayer of a conductivity opposite to said one type of conductivity, and an photosensitive sublayer for generating light-induced photocurrents in response to said input light signals placed between said first doped sublayer and said second doped sublayer;
   common electric contact means which is in electric contact at least with said first doped sublayer in each of said individual photosensitive elements;
   a first current collecting contact on said common electric contact means; and
   a second current collecting contact on said second doped sublayer in each of said individual photosensitive elements.

2. The solid-state wavelength demultiplexer of claim 1, wherein in each of said individual photosensitive elements said second doped sublayer is a heavily-doped sublayer of N-type of conductivity and is transparent to an input light signal defined by said predetermined energy gap.

3. The solid-state wavelength demultiplexer of claim 2, wherein in each of said individual photosensitive elements said first doped sublayer is a sublayer of P-type of conductivity which is doped to a lower level than said second doped sublayer and which is absorptive to said input light signal defined by said predetermined energy gap.

4. The solid-state wavelength demultiplexer of claim 3, wherein said energy gap has a constant value in said second doped sublayer and in said undoped photosensitive sublayer and has a gradient in said first doped sublayer.

5. The solid-state wavelength demultiplexer of claim 3, wherein said common electric contact means is a P-type doped layer.

6. The solid-state wavelength demultiplexer of claim 5, wherein said common substrate has a doped buried layer which is in electrical contact with said common electric contact means and is of a P-type doped layer.

7. The solid-state wavelength demultiplexer of claim 6, wherein said multiple-layered stack of individual photosensitive elements has a lowermost photosensitive element nearest to said common substrate and an uppermost photosensitive element exposed to said incoming light signals, said demultiplexer further comprising a buffer layer grown on said buried layer between said lowermost photosensitive element and said doped buried layer.

8. The solid-state wavelength demultiplexer of claim 1, wherein each of said individual photosensitive elements said first doped sublayer is a sublayer of P-type of conductivity which is doped to a lower level than said second doped sublayer and which is absorptive to said input light signal defined by said predetermined energy gap.

9. The solid-state wavelength demultiplexer of claim 8, wherein said energy gap has a constant value in said second doped sublayer and in said undoped photosensitive sublayer and has a gradient in said first doped sublayer.

10. The solid-state wavelength demultiplexer of claim 8, wherein said common electric contact means is a P-type doped layer.

11. The solid-state wavelength demultiplexer of claim 10, wherein said common substrate has a buried doped layer which is in electrical contact with said common electric contact means and is of a P-type doped layer.

12. The solid-state wavelength demultiplexer of claim 11, wherein said multiple-layered stack of individual photosensitive elements has a lowermost photosensitive element nearest to said common substrate and an uppermost photosensitive element exposed to said incoming light signals, said demultiplexer further comprising a buffer layer grown on said buried layer between said lowermost photosensitive element and said doped buried layer.

13. The solid-state wavelength demultiplexer of claim 1, wherein said photosensitive sublayer is an undoped sublayer.

14. The solid-state wavelength demultiplexer of claim 1, wherein said photosensitive sublayer is a lightly doped sublayer and said second sublayer is a heavily doped sublayer.

15. The solid-state wavelength demultiplexer of claim 1, where said individual photosensitive elements are made of a material selected from the group consisting of GaInAs, GaInAsP, GaInAsSb, and GaAlAs.

16. The solid-state wavelength demultiplexer of claim 1, wherein said common electric contact means is a P-type doped layer.

17. The solid-state wavelength demultiplexer of claim 1, wherein each said second doped sublayer in each of said individual photosensitive elements has an exposed portion and wherein said second current collecting contact on said second doped sublayer is located on said exposed portion.

* * * * *